United States Patent
Andre et al.

(10) Patent No.: US 10,268,591 B2
(45) Date of Patent: *Apr. 23, 2019

(54) DELAYED WRITE-BACK IN MEMORY

(71) Applicant: Everspin Technologies, Inc., Chandler, AZ (US)

(72) Inventors: Thomas Andre, Austin, TX (US); Syed M. Alam, Austin, TX (US); Chitra Subramanian, Mahopac, NY (US); Javed S. Barkatullah, Austin, TX (US)

(73) Assignee: Everspin Technologies Inc., Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/986,167

(22) Filed: May 22, 2018

(65) Prior Publication Data
US 2018/0267899 A1 Sep. 20, 2018

Related U.S. Application Data

(63) Continuation of application No. 15/141,379, filed on Apr. 28, 2016, now Pat. No. 9,990,300.

(51) Int. Cl.
*G06F 12/00* (2006.01)
*G06F 12/0893* (2016.01)
(Continued)

(52) U.S. Cl.
CPC ........ *G06F 12/0893* (2013.01); *G06F 3/0611* (2013.01); *G06F 3/0659* (2013.01);
(Continued)

(58) Field of Classification Search
CPC ............ G06F 12/0893; G06F 12/0862; G06F 12/0802; G06F 3/0611; G06F 3/0659; G06F 3/0683; G06F 2212/6026
See application file for complete search history.

(56) References Cited

U.S. PATENT DOCUMENTS 6,330,636 B1  12/2001  Bondurant et al.
9,990,300 B2   6/2018  Andre et al.
(Continued)

FOREIGN PATENT DOCUMENTS

EP  2814035 A1 * 12/2014  ......... G11C 11/1673
EP  2814035 A1    12/2014
(Continued)

OTHER PUBLICATIONS

International Search Report and Written Opinion issued in International Application No. PCT/US2017/015637, dated Apr. 11, 2017 (13 pages).

*Primary Examiner* — Shawn X Gu
(74) *Attorney, Agent, or Firm* — Bookoff McAndrews, PLLC

(57) ABSTRACT

A memory having a delayed write-back to the array of data corresponding to a previously opened page allows delays associated with write-back operations to be avoided. After an initial activation opens a first page and the read/write operations for that page are complete, write-back of the open page to the array of memory cells is delayed until after completion of a subsequent activate operation that opens a new page. Techniques to force a write-back in the absence of another activate operation are also disclosed.

20 Claims, 7 Drawing Sheets

(51) Int. Cl.
  *G06F 3/06*     (2006.01)
  *G06F 12/0802*  (2016.01)
  *G06F 12/0862*  (2016.01)
  *G11C 7/10*     (2006.01)
  *G11C 7/22*     (2006.01)
  *G11C 16/32*    (2006.01)
  *G11C 11/16*    (2006.01)
  *G06F 12/02*    (2006.01)
  *G06F 12/0804*  (2016.01)
  *G06F 12/0846*  (2016.01)
  *G06F 12/0855*  (2016.01)

(52) U.S. Cl.
  CPC ........ *G06F 3/0683* (2013.01); *G06F 12/0215* (2013.01); *G06F 12/0802* (2013.01); *G06F 12/0862* (2013.01); *G11C 7/1039* (2013.01); *G11C 7/1042* (2013.01); *G11C 7/22* (2013.01); *G11C 11/1693* (2013.01); *G11C 16/32* (2013.01); *G06F 12/0804* (2013.01); *G06F 12/0851* (2013.01); *G06F 12/0855* (2013.01); *G06F 2212/1024* (2013.01); *G06F 2212/2024* (2013.01); *G06F 2212/3042* (2013.01); *G06F 2212/6026* (2013.01); *G11C 2207/2245* (2013.01); *G11C 2207/2272* (2013.01)

(56) References Cited

U.S. PATENT DOCUMENTS

| | | |
|---|---|---|
| 2005/0257120 A1 | 11/2005 | Gorobets et al. |
| 2017/0315920 A1 | 11/2017 | Andre et al. |

FOREIGN PATENT DOCUMENTS

| | | | |
|---|---|---|---|
| WO | 0030116 A1 | 5/2000 | |
| WO | WO-0030116 A1 * | 5/2000 | ............... G11C 8/00 |

* cited by examiner

DELAYED WRITE-BACK IN MEMORY

CROSS-REFERENCE TO RELATED APPLICATION(S)

This application is a continuation of U.S. application Ser. No. 15/141,379, filed Apr. 28, 2016, the entirety of which is incorporated herein by reference.

TECHNICAL FIELD

The disclosure herein relates generally to memory devices having a delayed write-back to the array, and, more particularly, to circuits and methods for supporting such delayed write-back operations in memory devices.

BACKGROUND

Spin-torque magnetic memory devices store information by controlling the resistance across a magnetic tunnel junction (MTJ) such that a read current through the magnetic tunnel junction results in a voltage drop having a magnitude that is based on the state of the magnetoresistive stack. The resistance in each magnetic tunnel junction can be varied based on the relative magnetic states of the magnetoresistive layers within the magnetoresistive stack. In such memory devices, there is typically a portion of magnetoresistive stack that has a fixed magnetic state and another portion that has a free magnetic state that is controlled to be either of two possible states relative to the portion having the fixed magnetic state. Because the resistance through the magnetic tunnel junction changes based on the orientation of the free portion relative to the fixed portion, information can be stored by setting the orientation of the free portion. The information is later retrieved by sensing the orientation of the free portion. Such magnetic memory devices are well known in the art.

Some magnetoresistive memory devices such as magnetic random access memory (MRAM) support access protocols that are also used by other memory devices. For example, dynamic random access memory (DRAM) devices that use the synchronous double data rate protocol (e.g. DDR SDRAM, DDR2 SDRAM, DDR3 SDRAM, DDR4 SDRAM, etc.) are well known in the art. Some MRAM devices support such protocols, where the same operation codes for DDR SDRAM devices result in the same or similar operations in MRAM devices.

DETAILED DESCRIPTION

Figures 1, 2:
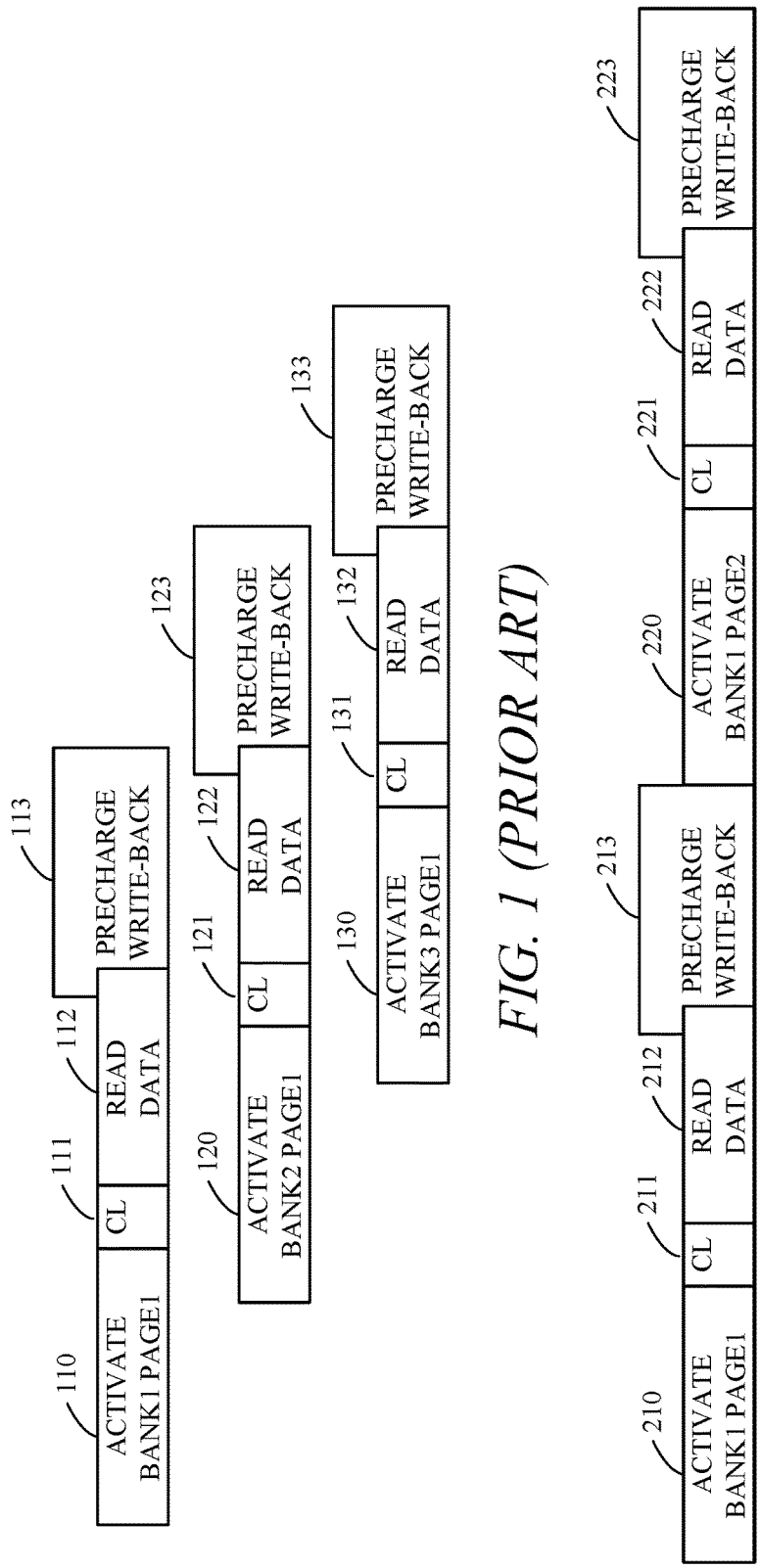
FIGS. 1 and 2 are block diagrams showing relative timing of various aspects of data access operations in a prior art memory device.

The following detailed description is merely illustrative in nature and is not intended to limit the embodiments of the subject matter or the application and uses of such embodiments. Any implementation described herein as exemplary is not necessarily to be construed as preferred or advantageous over other implementations.

For simplicity and clarity of illustration, the figures depict the general structure and/or manner of construction of the various embodiments. Descriptions and details of well-known features and techniques may be omitted to avoid unnecessarily obscuring other features. Elements in the figures are not necessarily drawn to scale: the dimensions of some features may be exaggerated relative to other elements to assist improve understanding of the example embodiments.

The terms "comprise," "include," "have" and any variations thereof are used synonymously to denote non-exclusive inclusion. The term "exemplary" is used in the sense of "example," rather than "ideal."

In the interest of conciseness, conventional techniques, structures, and principles known by those skilled in the art may not be described herein, including, for example, standard magnetic random access memory (MRAM) process techniques, generation of bias voltages, fundamental principles of magnetism, and basic operational principles of memory devices.

During the course of this description, like numbers may be used to identify like elements according to the different figures that illustrate the various exemplary embodiments.

For the sake of brevity, conventional techniques related to reading and writing memory, and other functional aspects of certain systems and subsystems (and the individual operating components thereof) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

Magnetic memory devices and other memory devices often include an array of memory cells divided into a plurality of banks or subarrays. In such memory devices, each bank can be accessed separately such that accesses between banks can be interleaved to optimize data throughput. Some magnetic memory devices support DDR memory protocols, where an activate operation opens a page of memory cells in a particular bank. A "page" of memory cells is understood to be a grouping of memory cells that are accessed together as a unit. In some instances, a "page" may constitute a "row" of memory cells. Opening a page moves the data for the page from the array of memory cells into a cache or other form of temporary storage where the data is more readily accessed. Once the page is activated (opened), read and write operations to the page can be performed. Upon completion of the read/write operations for the open page, the page is closed. When a page is closed, the array is returned to a state ready for a subsequent page activation, and the data in the closed page cannot be accessed again for reads and writes without re-opening the page. In some memory devices, data moved to temporary storage during the activate command is immediately written back to the array, and, in some cases, data corresponding to write operations performed while the page is opened is also immediately written to the memory cells in the array. In such memory devices, a precharge operation may only precharge the bit lines and de-assert the word line corresponding to the page. In other memory devices, data moved to temporary storage during an activate and data written to the open page is not stored into the array until just prior to closing the page. As such, in those memory devices, the precharge operation would also including performing the write-back of data from temporary storage to the array. By waiting until just prior to closing the page to write the data back to the array, a memory device can save power or improve timing specifications associated with the moving or modifying of the data.

Having multiple banks allows for multiple pages to be open, thereby enabling interleaving of accesses. This is because each bank has a corresponding cache or its own temporary storage that allows for separate reading and writing. FIG. 1 shows the interleaving of a plurality of memory reads corresponding to three different pages in three different banks. Each block represents the time consumed by the particular operation with respect to the other ongoing operations. The top row of blocks represents a read access to BANK1 PAGE1. At 110, the activate operation for BANK1 is occurring. During the activate operation, data corresponding to PAGE1 is retrieved from the portion of the array corresponding to BANK1 and stored in a cache for read/write access. As discussed in more detail below, the activate operation can be very time consuming, especially in magnetoresistive memory devices that use a self-referenced read operation to sense the data stored in the array.

After activation, a read request requires a read access time to fetch the particular data to be output. This corresponds to block 111, which is labeled CL for "CAS latency." CAS latency is a term commonly used to represent the time between receipt of a read request and the output of data corresponding to the read request. That time corresponds to the selection of the particular data in the open page and routing of that data to the outputs of the memory device. Read data is output during block 112. Notably, only a single read access for BANK1 PAGE1 is shown, but it is understood that many read and write accesses can occur while the page is open. In the prior art memory devices related to FIGS. 1 and 2, when all the accesses to the page are complete, a precharge command causes the page to be closed and data in the cache to be written back to the array at block 113. Such a write-back operation to the array can also be very time consuming relative to the time required to perform read and write operations while the data is in the cache.

As shown in FIG. 1, in order to "hide" some of the delay associated with the various operations, multiple pages can be opened in multiple banks. This allows the various signal lines used to convey commands, addresses, and data to and from the memory device to be used most efficiently. For example, once the activate command for BANK1 has been received by the memory, a second activate command corresponding to BANK2 can be sent. Because BANK2 has its own cache, activation of a separate page in BANK2 allows PAGE1 of BANK1 to be open at the same time as PAGE1 of BANK2. The second row of blocks in FIG. 1 shows that the time for activation of BANK2 PAGE1 at block 120 overlaps with portions 110-112 of the activation and read in BANK1. The read operation in BANK2 is similar to that in BANK1 in terms of timing, and is shown to include read access time 121, read data output 122, and precharge block 123. The third row of FIG. 1 shows similar operations 130-133 for BANK3.

As shown in FIG. 1, because the sequential accesses are in different banks (e.g. first a read from BANK1, then BANK2, and then BANK3), interleaving of the accesses allows read data can be output by the memory device relatively constantly. The read data 112 for BANK1 is immediately followed by the read data 122 for BANK2, which in turn is followed by the read data 132 for BANK3. Because the interleaving between banks allows delays associated with activation, read access time, and precharging to be hidden at least to some degree, high throughput can be achieved.

However, as shown in FIG. 2, in some instances sequential accesses may be to a different page in the same bank. In the example shown, BANK1 PAGE1 is activated at block 210, and after read access time 211, read data 212 is output. If the next access is a read to BANK1 PAGE2, then PAGE1 of BANK1 must be closed via precharge 213 before PAGE2 of BANK1 can be opened via activate 220. Following the activate 220, read data 222 is not output until after read access time 221. Precharge 223 then closes PAGE2 of BANK1. As is apparent from FIG. 2, such back-to-back accesses to the same bank do not allow the time associated with the activate, read access time, and the precharge to be fully hidden. It may be possible to begin the precharge operation as the last of the read data is output (i.e. slightly before the completion of the read data block 212), but, as is shown, the time delay between read data output 212 from the first page and the read data output 222 from the second page is significant.

In current dynamic random access memories (DRAM), the timing associated with activate and precharge operations is not much greater than that of other aspects of the data access cycle, and therefore the delay of a back-to-back operation such as that illustrated in FIG. 2 may be tolerable. However, in MRAMs, activate and write-back operations often take much longer, thereby resulting in a greater undesirable delay between data accesses for such same-bank sequential accesses.

In some MRAMs, a self-referenced read operation is used to sense the data stored in the array for a page to be accessed. In an example self-referenced read, the initial resistance through each of the memory cells in the page is sensed, then all of the memory cells in the page are written to a known state, and finally, the post-writing resistance through each of the cells is sensed again and compared with the initial resistance sensed before writing. Whether or not the resistance is the same after writing to the known state indicates the initial state of the memory cell. Notably, the self-referenced read is destructive, and leaves all of the memory cells in the known state written between the two sensing operations. Such a self-referenced read operation often takes a significant amount of time relative to other aspects of memory accesses. For example, activating a page in an MRAM may require of hundreds of nanoseconds, whereas a read operation to an open page may be on the order of tens of nanoseconds.

Similarly, the time required to write-back a page of data to the array upon completion of read/write accesses can be significant. For example, in order to extend the life of the MRAM device, large magnitude write current pulses that can quickly change the state of the free layer in a spin-torque memory cell are typically avoided as such large pulses can damage the sensitive layer in the magnetoresistive stack. In order to avoid breakdown of the layers, write pulses of a lower magnitude and longer duration are often employed as they enable the free layer to be switched with less adverse effects on the device layers. While promoting longer life for the memory devices, such long-duration write pulses extend the time needed for write-back operations.

Embodiments disclosed herein utilize a delayed write-back of closed-page data to help improve overall throughput in magnetoresistive memory devices. This is accomplished by delaying the write-back of the data corresponding to a page that is being closed until a time at which the performance of the write-back does not adversely affect the timing of other ongoing operations associated with reads and writes. As disclosed herein, in some embodiments the write-back corresponding to a previously open page is performed following the activate operation for the next page to be accessed.

Figure 3:
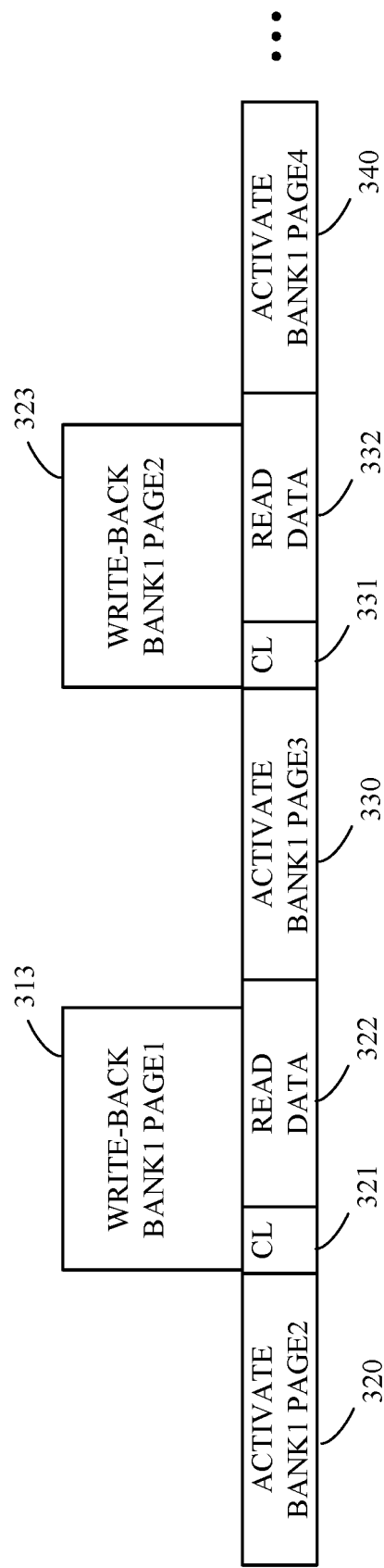
FIG. 3 is a block diagram showing relative timing of various aspects of data access operations in a memory device in accordance with an exemplary embodiment.

FIG. 3 aids in illustrating the delayed write-back concept. As shown in FIG. 3, at block 320 an activate for BANK1 PAGE2 occurs. Following the read access time 321, read data 322 is output. Once the activate operation corresponding to BANK1 PAGE2 is complete and the PAGE2 data has been transferred from the array to the cache used for read and write operations, BANK1 in the array is no longer active. As such, the write-back operation corresponding to the previously opened bank can be performed during the time read and write operations for the newly activated bank occur. As shown in FIG. 3, the write-back operation for BANK1 PAGE1 at block 313 occurs once the activate operation 320 for BANK1 PAGE2 has completed.

As discussed above, write-back operations for a bank that is being closed typically occur as soon as the read and write accesses to that bank are complete, and such a write-back operation is typically prompted by a precharge command received by the memory device. As discussed herein, rather than performing the write-back immediately upon completion of the read and write accesses, thereby preventing a subsequent activate operation from fetching data from the array until after that write-back operation is complete, embodiments disclosed herein delay that write-back operation until a time at which the write-back can be hidden and not impact timing of the subsequent activate operation. Because the write-back for the previously open page is writing data corresponding to a closed page to the array, no adverse delays are caused by shifting the write-back operation such that it occurs after the next page has been opened. In other words, there is no rush to put the data back into the array as another, different page is currently being accessed.

As illustrated in FIG. 3, by delaying the write-back corresponding to the previously open page within a bank until after the next activate operation for that bank is complete, the precharge time associated with that bank can be hidden, thereby greatly improving the latency and throughput characteristics for the memory device. In FIG. 3, the initial state of the memory device corresponds to a point in time where BANK1 PAGE1 was previously opened, but the read and write operations corresponding to that page have been completed, and the PAGE1 data is ready to write back to the array. With PAGE1 data ready to write-back, the activate command corresponding to BANK1 PAGE2 is received, thereby indicating that PAGE2 is to be opened for read and write accesses. Instead of completing that write-back operation for PAGE1 prior to activation of PAGE2, PAGE2 is opened first, and, once that activation is complete, the write-back operation for PAGE1 can occur without delaying any of the operations associated with activating PAGE2 or accessing data in newly-open PAGE2 (e.g. read access time 321 and read data 322).

Following accesses to BANK1 PAGE2, the activate operation for PAGE3 of BANK1 occurs at block 330. Immediately upon completion of the activate for PAGE3, the write-back for BANK1 PAGE2 can occur at block 323 while the read access time 331 and read data 332 for PAGE3 are simultaneously occurring. Similarly, the write-back for PAGE3 begins once the activate for BANK1 PAGE4 completes at block 340. Notably, the write-back operation for the previously open page can occur as soon as all of the portions of the next activate command that would prevent the write-back from occurring are complete. For example, while some portions of the write-back and activate utilize the same circuitry on the memory device (e.g. write drivers, column decoders, etc.), other portions may use independent circuitry such that some aspects of the activate operation are not complete when the write-back operation begins.

Embodiments described herein use the time after an activate operation, when reads and writes to the newly opened page are occurring, to write-back the data corresponding to the previously open page to the array. In order to accomplish this, the data corresponding to the previously open page must be stored in a location that will not interfere with the activation of the new page to be accessed. In some embodiments, each bank of the memory device includes two cache structures, where a first cache serves as the primary, or active cache for read/write operations to the open page and a second cache serves as a temporary storage location for data corresponding to the page for which accesses are complete but write-back has not yet occurred.

Figure 4:
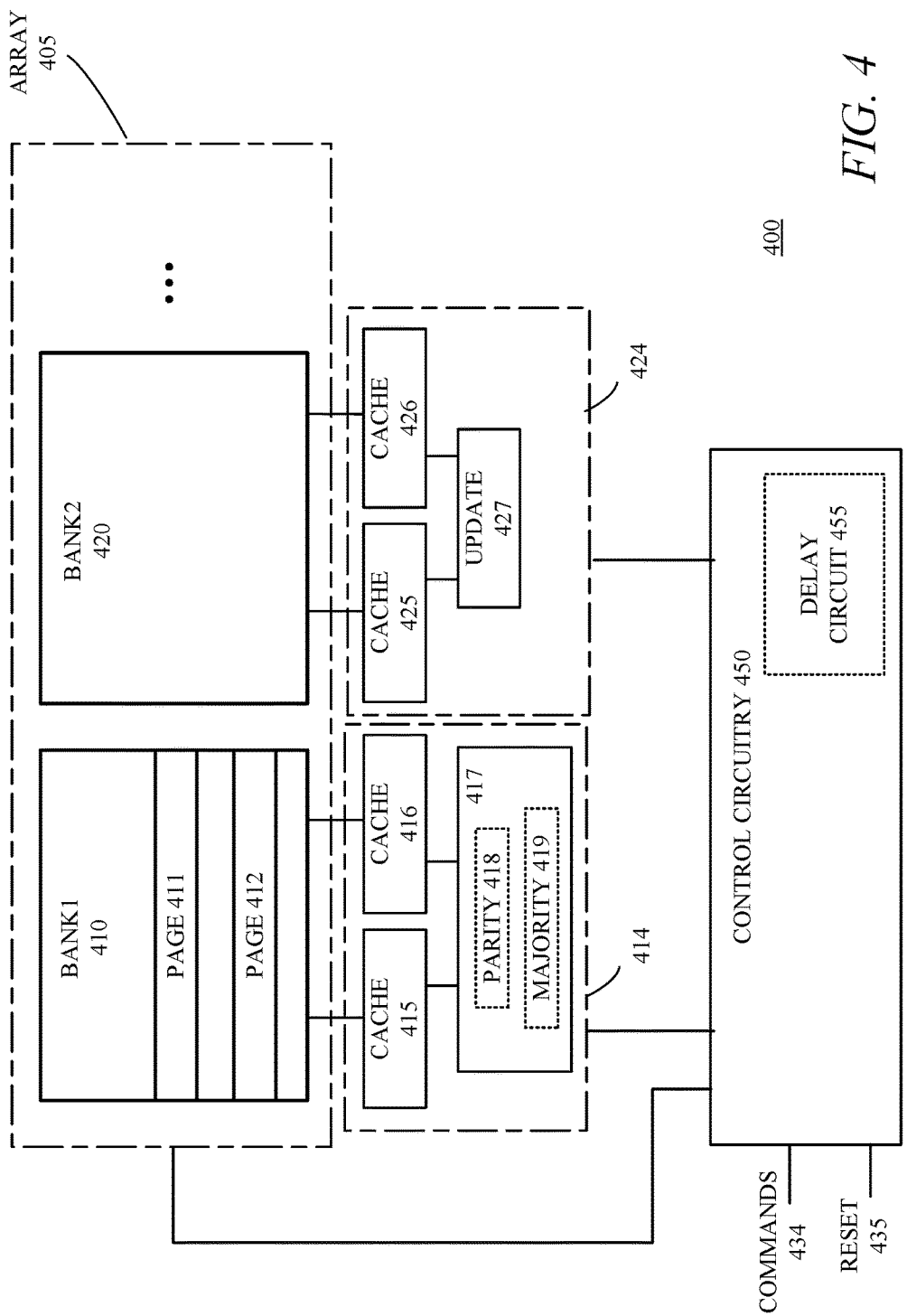
FIG. 4 is a schematic diagram of a portion of a magnetic memory device in accordance with an exemplary embodiment.

Turning to FIG. 4, a schematic diagram of a portion of a memory device 400 in accordance with various embodiments is presented. Memory device 400 includes an array 405 of memory cells. In some embodiments, the memory cells are non-volatile spin-torque MRAM cells, whereas in other embodiments, the memory cells are other types of memory cells such as, for example, DRAM cells or other resistive memory cells. As shown in FIG. 4, array 405 includes a plurality of banks, including BANK1 410 and BANK2 420. Each of banks 410 and 420 includes a corresponding set of circuitry 414 and 424, respectively, used to temporarily store data for read and write accesses for pages within the banks 410 and 420. Circuitry 414 for BANK1 410 includes a first cache 415, a second cache 416, and update circuitry 417. The update circuitry 417, which may include parity calculator 418 and/or majority detection circuit 419 is discussed in additional detail below.

As shown in FIG. 4, caches 415 and 416 are coupled to BANK1 410 to allow data to be transferred between the BANK1 410 of the array 405 and caches 415 and 416. In some embodiments, each of the caches 415 and 416 includes static random access memory (SRAM) memory cells, whereas in other embodiments, the caches 415 and 416 are made up of registers, flip-flops, or other storage circuits that are used to store data. Caches 415 and 416 include enough storage to accommodate a page of data from BANK1 and may also include additional storage to store the address of the page, parity or other error correction code (ECC) information for the page, and any inversion or other information relevant to the page. In some example embodiments, the caches 415 and 416 are on the order of 64 data words at 8 or 16 bits/word. In other example embodiments, the caches store 128 or 256 words. In some embodiments, banks are combined to maintain the number of data words stored when the word size increases, for example, from 8 to 16 bits. The size of the caches and that of the pages accessed can be adapted to suit the needs of the application.

As illustrated in FIG. 4, each bank in the array 405 has a corresponding set of caches and update circuitry. BANK2 420 is shown to be coupled to caches 425 and 426 with update circuitry 427. Having separate cache structures for each bank enables multiple pages in different banks to be open simultaneously, thereby allowing for interleaved accesses. While the embodiment depicted in FIG. 4 shows two caches for every bank, in other embodiments, more than two caches are included for each bank, thereby allowing the write-back for more than one page to be deferred until a later point in time. Such additional caches may be appropriate in embodiments where the time required for a write-back is much longer than that needed for activate operations or where the access pattern would benefit from deferment of write-back for multiple pages. In yet other embodiments, each bank has one corresponding cache for storage of the open page for read/write operations, but shares a second cache with one or more other banks, where the second cache is used exclusively for storing data corresponding to a closed page that has not yet been written back. Note that sharing a write-back cache between banks could limit activate operations to those banks to ensure that conflicts do not occur where both banks require the use of write-back cache at the same time.

Control circuitry 450 is coupled to array 405 and circuitry 414 that includes the caches 415 and 416 as well as the update circuitry 417. In the embodiment shown in FIG. 4, control circuitry 450 is coupled to all of the banks in the array 405 and all of the cache structures and update circuitry for those banks. As such, control circuitry 450 provides global control over memory access operations in the embodiment of FIG. 4. In other embodiments, dedicated control circuitry is provided for each bank such that the operations for each bank are individually controlled.

Control circuitry 450, which may include, for example, a state machine, processor, microcontroller, or logic circuitry is configured to control the movement of data, and operations performed on the data, for the various memory access operations supported by the memory device. Control circuitry 450 receives commands 434 and a reset signal 435. In other embodiments, control circuitry 450 receives additional signals, either sourced internal to the memory device or external from the memory device, that provide the control circuitry 450 with information or instructions to facilitate the data storage and retrieval operations. For example, control circuitry 450 may receive a self-refresh signal that indicates that no immediate accesses are impending and the memory device has an opportunity to perform other operations while such a signal is asserted. The commands 434 received by the control circuitry 450 can include commands received from an external memory controller or other control device that issues commands to the memory device. For example, an external memory controller can provide commands 434 to the control circuitry 450 where such commands include activate, read, write, precharge, read with autoprecharge, write with autoprecharge, and refresh commands. In other embodiments, the commands directing the actions of the memory device may be processed in a hierarchical manner such that some shared circuitry performs some of the actions related to each command, and the control circuitry 450 receives more localized commands 434 that are derived from higher-level commands received by the memory device.

In operation, the control circuitry 450 is configured to, in response to a first activate command received by the memory device, transfer first page data from a first location in the array to a first cache. In an example corresponding to the FIG. 4, the first activate command causes the control circuitry 450 to provide the appropriate signals to the array 405 and cache 415 such that the data corresponding to FIRST PAGE 411 in BANK1 410 is transferred into the cache 415. In some embodiments, loading the data for FIRST PAGE 411 into cache 415 includes performing a self-referenced read for the memory cells included in FIRST PAGE 411. In other embodiments, referenced read operations (e.g. where the resistance of each memory cell is compared with a reference to determine the data stored therein), or other techniques for ascertaining the data stored in each memory cell are used to load the data for FIRST PAGE 411 into cache 415.

Once the data for FIRST PAGE 411 is loaded into cache 415, FIRST PAGE 411 is considered to be "open," and read and write operations to FIRST PAGE 411 can occur by reading the data in the cache 415 or overwriting data in the cache 415. Each read or write command is accompanied by address information that allows specific words or sets of words in FIRST PAGE 411 to be accessed. Once all of the read and write accesses to FIRST PAGE 411 are complete, the data for FIRST PAGE 411, which may include new data added by write operations, is moved from the cache 415 to the cache 416. In some embodiments, the indication that the read/write operations to FIRST PAGE 411 are complete is based on receipt of a precharge command by the memory device. In other embodiments, data is retained in the cache 415, which may be referred to as the primary cache, until a subsequent activate operation for BANK1 410 is received by the memory device. As discussed in additional detail below, additional commands or signals are used in some embodiments to cause the data in cache 415 to be moved either into cache 416 or directly back into BANK1 of array 405.

After transferring the first page data from the first cache 415 to the second cache 416, first cache 415 is available to receive data corresponding to a new page. Thus, in response to a second activate command corresponding to SECOND PAGE 412 of BANK1 410, the control circuitry 450 issues the appropriate control signals such that second page data corresponding to SECOND PAGE 412 is transferred from the location corresponding to SECOND PAGE 412 in BANK1 410 of the array 405 into the cache 415. SECOND PAGE 412 is thereby "opened" and available for read and write operations. Once the activate operation for SECOND PAGE 412 is complete, or has progressed far enough so as to not interfere with a write-back operation to BANK1, the first page data corresponding to FIRST PAGE 411 that is stored in cache 416 can be written back to the appropriate location in BANK1 of the array 405. As noted above, the address for FIRST PAGE 411 can be included with the data stored in the cache 416 so the location to which the first page data is to be written in the array 405 is known. In other embodiments, a separate register or storage location can be used to store the address information for each page along with any other appropriate page-specific information such as parity information or inversion status.

Parity information or other forms of ECC are used in some embodiments to prevent or reduce data errors. Parity calculation is well known in the art, and storing a set of parity bits for a page in the bank with the page data allows for parity checking to confirm data validity and may allow for correction of data errors in some instances. In the example described above with respect to FIG. 4, when the first page data corresponding to FIRST PAGE 411 is written back into the array 405, that data may include parity information. Because the data included in FIRST PAGE 411 may be modified by write operations that are performed while the FIRST PAGE 411 is open, new parity calculations need to be performed before the data is written back to the array 405. In some embodiments, the parity calculations are performed as each write operation to the page are completed such that the parity information stored with the data in cache 415 is always current. In such embodiments, the accurate parity information can be shifted with the data from cache 415 to cache 416 prior to writing back at a later time. However, performing such parity calculations in real-time can be costly in terms of time and resources (e.g. extra power consumption would be required). As such, because it is known that no further write operations to FIRST PAGE 411 will occur when the data for FIRST PAGE 411 is moved to the cache 416, the parity calculations for FIRST PAGE 411 can be performed in conjunction with the moving of the data from cache 415 to cache 416. In FIG. 4, parity calculator 418 is included in update circuitry 417, where the parity information is updated when the data is transferred from cache 415 to cache 416.

Because destructive self-referenced read operations that write all of the memory cells in a selected page to a first state leave all the cells in the same state at the conclusion of an activate operation, determining whether the majority of the bits in the page are in the first state (e.g. binary "0") or in the second state (e.g. binary "1") before the page is written back can help reduce power consumption. For example, if the activate operation leaves all the memory cells in the page in the first state corresponding to a binary "0," and, when the data is ready to be written back, the majority of the bits in the page to be written back are a "0," then less than half of the memory cells will require the one or more write pulses that are used to change the free layer in those cells to the state corresponding to a binary "1." If, however, the majority of the bits in the page are "1's," then more than half of the memory cells will have to be written to in order to change their state. In such an instance, it is valuable to invert all of the bits for the page such that the state that formerly represented a "0" now represents a "1." By inverting all of the bits when the majority does not correspond to the state the memory cells are left in when the activate is complete, the write back will always involve writing to no more than half of the memory cells in the page.

In order to support such inversion after a majority detection, an inversion status bit is maintained for each page to indicate if the data stored in the array 405 for that page is inverted or not. In addition, a majority detection needs to occur for each page prior to write-back of the page if data in the page was modified while the page was open. As such, majority detector 419 is included in the update circuitry 417. As was the case for the parity calculation, majority detection can be performed in real time with each write operation, but it is likely more efficient to perform the majority detection and setting of the inversion bit once the page is in the process of closing. Thus, in some embodiments, majority detection is performed when the data for a page is transferred from the first cache 415 to the second cache 416.

In order to facilitate all of the internal operations associated with moving the data between the various locations and performing the steps associated with parity calculation, majority detection, etc., the control circuitry 450 generates a plurality of timing signals that direct the circuitry on the memory device so that the proper operations are performed in the proper order and at the proper time. In some embodiments, those timing signals are generated by delay circuit 455, which is shown to be included in control circuitry 450. In some embodiments, the delay circuit includes a plurality of delay blocks or circuits that are used to generate the timing signals associated with the various functions that occur in accessing data in the memory array 405. For example, in response to an activate operation for BANK1 in the situation where a previous page in BANK 1 has not yet been written back, a plurality of timing signals are generated such that the data from cache 415 is moved to cache 416, any parity calculation and majority detection is performed, the page to be opened is loaded into the cache 415, and, once the activate is complete, the data in cache 416 is written back to the array 405. Thus a single transition of a signal indicating an activate may trigger multiple signal transitions appropriately spaced in time by the delay circuit 455 so that the appropriate operations occur at the appropriate time. The spacing between various timing signals may be programmable such that the relative time at which different operations are performed can be adjusted by, for example, storing values in a programmable register.

Note that in some instances, sequential activates can be received that correspond to the same page in the same bank. For example, FIRST PAGE 411 may be opened, a number of read/write operations to the data in FIRST PAGE 411 performed, and then a precharge command received indicating that FIRST PAGE 411 should be closed. In some embodiments, receipt of the precharge command does not result in the data being written back to the array as the control circuitry 450 is waiting for the next activate command to do so. As such, if a new activate operation is received corresponding to FIRST PAGE 411 directing the memory to re-open it, transferring data from the array 405 to cache 415 will not result in the data for FIRST PAGE 411 being placed in cache 415 as the data for FIRST PAGE 411 is not yet back in BANK1 410 of the array 405. In some embodiments, the data for FIRST PAGE 411 is still in the cache 415 when the re-activation command for FIRST PAGE 411 is received. As such, in some embodiments, control circuitry 450 includes a page address comparator that is configured to compare the address accompanying an activate command with the address of the last page opened. If the comparison indicates that the new page to be opened is the same as the previous page, the control circuitry 450 will do nothing if the data for the previously opened page is still in the primary cache 415. If the new page to be opened is the same as the previous page and the data for that page has already been transferred to cache 416, the data can be either be transferred directly back to cache 415 or written back to the array 405 before the data is retrieved once again from the array and loaded into cache 415.

Another potential issue with the delayed write-back of the previous page occurs when the previous page of data is not written back in response to a precharge command, but instead is waiting for another activate command that never comes. For example, the final data accesses to a bank before power is turned off may result in the data for the accessed page residing in the cache 415 or 416 awaiting the next activate. Without such an activate, the write-back to the array 405 would not normally be initiated. As such, power-down may occur with the data not yet written back to the array 405. If the cache structures are volatile storage, the data can be lost.

In some embodiments, this issue is addressed by using non-volatile storage for one or both of the caches for each bank. In other embodiments, the memory device can periodically perform a write-back to the array at a time when no new activate command will be received. In some embodiments, a refresh command or refresh signal received by the memory device indicates that the memory controller will not be issuing an activate any time soon, and the memory has the chance to perform a "refresh" operation. Such refresh operations are used in DRAMs to replenish charge on capacitors in one or more of the rows in the array of memory cells. In order to perform the refresh, all banks in the DRAM are typically closed. As such, even though MRAM does not need to perform refresh operations, it can take the refresh command or signal as an indication that all banks should be closed and the data corresponding to pages currently held in the caches should be written back to the array. In other embodiments, the refresh command/signal can be used to initiate a write-back to one of many banks, where the memory device keeps track of which banks have been written-back, thereby knowing in which bank the next refresh will trigger a write-back.

In other embodiments, the reset signal 435 can be used as a trigger to initiate write-backs to the array. By specifying to users that the reset signal needs to be asserted in order to ensure the data in the memory is non-volatile, users can assert the reset signal before events such as a power down, thereby causing the data for the last opened page to be transferred from, for example, cache 415 to cache 416 (with possible parity and inversion calculations), and then written back into memory array 405.

In yet other embodiments, a new operation code can be employed to specifically cause a write-back to occur without the need for another activation. For example, a "STORE" operation code could be sent by the memory controller to the memory, where the STORE operation code causes the MRAM to write-back any rows that are awaiting write-back. Such a STORE operation code can either be bank-specific in that it only directs the data corresponding to one bank to be written back to the array (STORE-BANKx, where x=the bank number), it can cause the data for a subset of banks to be written back, or it can cause the data for all banks to be written back (STORE-ALL). Such a new operation code(s) can be used to clean up any volatile data on the memory device, forcing it to be stored in the non-volatile storage of the array 405 such that it is not susceptible to loss if power is removed.

When write-back operations to a large page (many bits per page) or multiple banks occurs, it may be desirable to stagger the write-back operations to subsets of the memory cells in order to reduce power and current spikes associated with the write-back operations. In such staggering, portions of the memory cells are written back to at different times such that the current draw and power consumption associated with the write back is distributed in time. Thus, a first portion of the data to be written back is written at a different time than a second portion of the data. For example, in a write-back to a large page, half of the bits in the page may be written back first, and then the other half of the bits written back later. In another example corresponding to a STORE-ALL command or operation code, the data for half of the banks is written back first and then the data for the other half of the banks is written back. In another STORE-ALL example, half of the bits in each of the banks is written back first, and then the other half of the bits in each bank are written back. In yet another STORE-ALL example, write-back operations are serialized such that a bank or a group of banks is waiting for the completion of write-back operation(s) in another bank or a groups of banks. Such staggering of write-back operations can be split into many phases, can be set to be programmed, and can be bank-specific, memory cell-specific, or both.

If the delay circuit 455 is used to generate the timing signals used to perform the write-back operations and such signals are delay-based signals generated in response to a trigger signal, the write-back operations can be accomplished without the need for a clock signal. This allows a system to issue an indication that write-back should occur (e.g. a refresh, self-refresh, reset, or STORE command) and then turn off the clock without concern for the data not being written back. When write-backs are staggered, the delay circuit can use feedback or daisy-chain multiple delay circuits to ensure that some write-back operations occur before others.

After all of the pages in a bank have been written-back to the array 405, the next activate operation should not result in a write back of data stored in cache 415. As such, a flag can be used for each bank to indicate whether the bank has a page that is open and/or awaiting write-back. Thus, when the device is first turned on, the flag is cleared, indicating that no pages are open and awaiting write-back. When the first page is opened, the flag is set such that a subsequent activate will trigger a write-back of the first page data. If a STORE or other write-back indication is received, the data is written back and the flag is cleared. In some embodiments, status registers already present in standard-compliant memory devices can be used to store such flags.

In some embodiments, the flags associated with whether or not a bank is open or has data waiting to be written back can be manipulated to support testing, burn-in, or other operations that are designed to exercise the memory device in a manner that differs from normal operation. For example, some testing operations want to continuously access the same page within a bank without concern for the actual data stored therein. By keeping the open indication for that bank clear and not performing the comparison of the address for the page to be activated with the last page activated, the memory device can be exercised as desired rather than having it do nothing in response to an attempt to open a page that is already opened.

While the discussion above with respect to FIG. 4 describes transferring newly-activated pages to a primary cache 415 and the moving that data to secondary, write-back cache 416 prior to write back, in other embodiments, rather than moving the data between the caches, the roles of the caches can be changed. For example, a first activate can load a first page of data in to a first cache, while the second activate loads a second page of data into a second cache before writing the first page of data back into the array from the first cache. Reads and writes to the first page would occur using the first cache, and reads and write to the second page would use the second cache.

Figure 5:
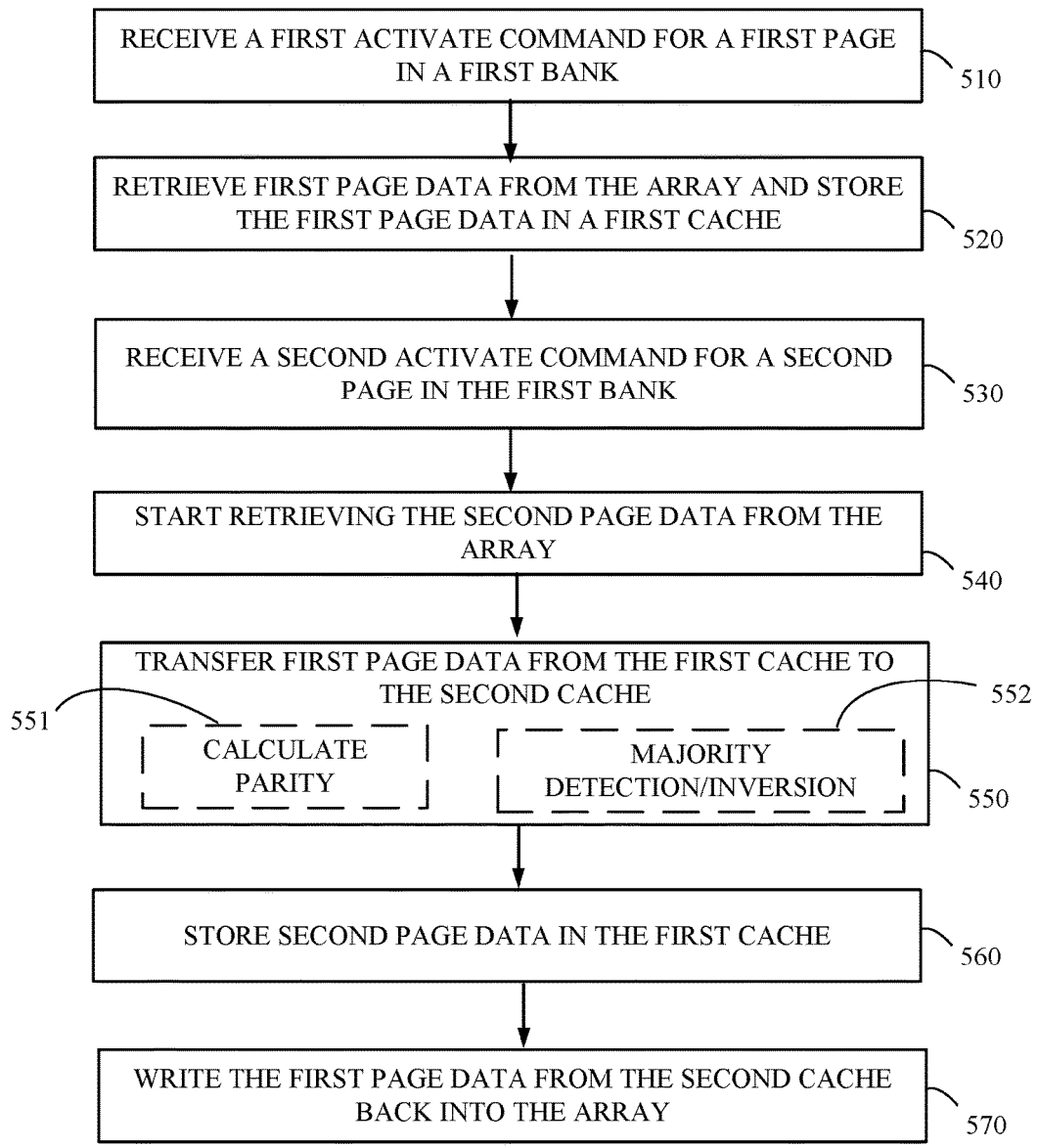
FIGS. 5-7 are flow charts corresponding to methods for performing and supporting delayed write-back in a magnetic memory in accordance with exemplary embodiments.
Figure 6:
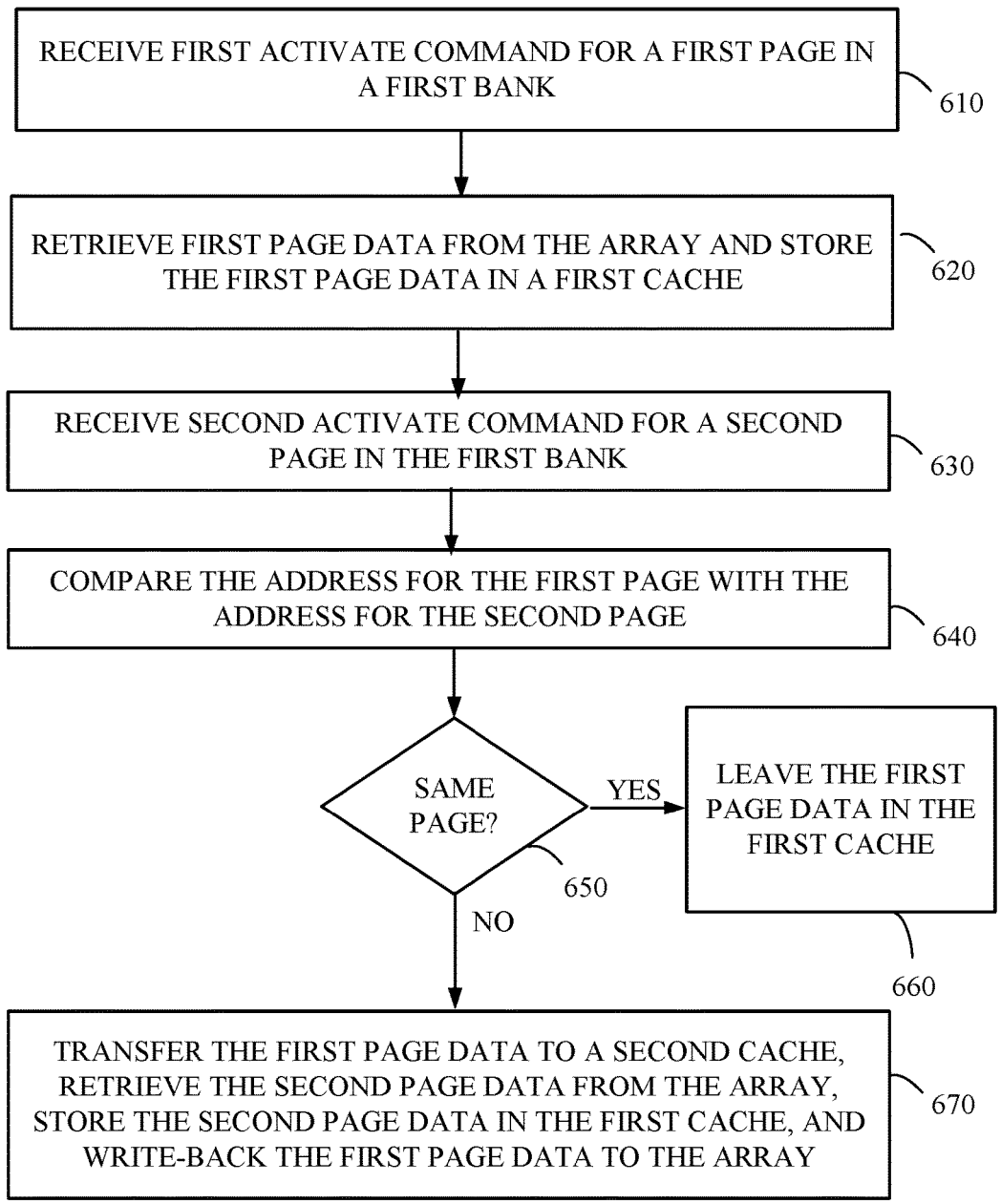
Figure 7:
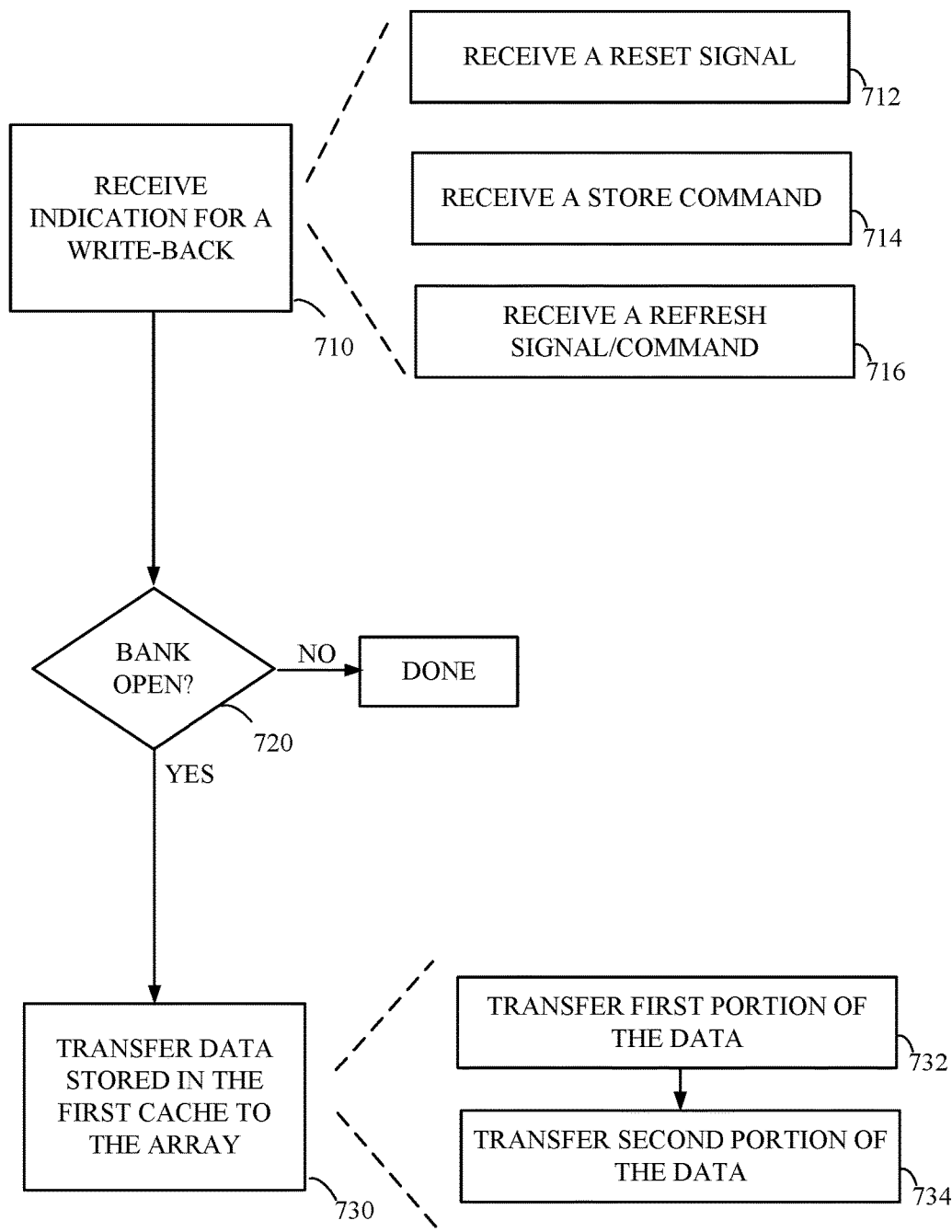

FIGS. 5-7 are flow charts that illustrate exemplary embodiments or aspects of embodiments of methods for supporting a delayed write-back in memory devices. In one example, the memory devices include an array of spin-torque magnetic tunnel junction memory cells. The operations included in the flow charts may represent only a portion of the overall process used to operating the device. For illustrative purposes, the following description of the methods in FIG. 5-7 may refer to elements mentioned above in connection with FIG. 4. It should be appreciated that method may include any number of additional or alternative tasks, the tasks shown in FIGS. 5-7 need not be performed in the illustrated order, and the methods may be incorporated into a more comprehensive procedure or process having additional functionality not described in detail herein. Moreover, one or more of the tasks shown in FIGS. 5-7 could be omitted from an embodiment as long as the intended overall functionality remains intact.

Turning to FIG. 5, at 510 a first activate command for a first page in a first bank of the memory device is received. At 520, in response to the first activate command, a first page of data is retrieved from the array and stored in a first cache on the memory device. Once the first page has been activated in this manner, read and write operations to the data in the first page can occur by accessing the first cache.

At 530, a second activate command for a second page in the first bank is received. As discussed above with respect to FIG. 4, in order to move the data for the second activate command from the first bank of the array into the first cache for access, the data corresponding to the first page is moved to a second cache before eventually being written back into the array. However, by delaying the write-back of the data corresponding to the first page until after the activation for the second page is complete, the time associated with writing back the first page data can be hidden and will not delay any read or write operations directed at the second page.

At 540, in response to the second activate command, the memory starts retrieving the second page data from the array. At 550, the first page data is transferred from the first cache to the second cache. Notably, the transfer of the first page data can occur at the same time as the retrieval of the second page data is initiated as long as the first page data is out of the first cache before the second page data is stored there. While the flow diagram of FIG. 5 indicates that the second page data retrieval begins before the transfer of the first page data, the ordering of these steps is not critical as long as there is no conflict. In some embodiments, the transfer at 550 begins in response to the second activate command, whereas in other embodiments, the transfer is triggered by a precharge command corresponding to the first page received prior to the second activate command. Thus, a precharge command may trigger the movement of the first page data from the first cache to the second cache, but the data may remain in the second cache until a subsequent activate command causes it to be written back.

Notably, in some embodiments, the precharge command is not used to trigger movement of the data from the first cache to the second cache. In such embodiments, the precharge command may serve no function such that the memory device does nothing in response to a precharge command. By eliminating the need for precharge commands, the timing associated with the provision of such precharge commands in standard protocols such as those used for DDR memory devices can be relaxed in ways that allow more flexibility to memory system designers.

Transferring the first page data from the first cache to the second cache at 550 can include performing parity calculation at 551 such that the appropriate parity, or other ECC information, is available at the time the first page data is to be written back into the array. Similarly, majority detection and inversion at 552 can be included as part of the data transfer from the first cache to the second cache. Performing parity calculation and majority detection at this point in time makes sense as any writes to the first page complete, and thus the data being transferred is final with respect to parity and inversion determinations related to storage of the data in the array. While parity calculation and majority determination can be done while the data is being transferred between caches, in other embodiments, such operations may be performed at other points in time before or after such transfer occurs.

At 560 the second page data is stored in the first cache, thereby marking the completion of the second activate operation. Because the second activate operation is complete, the write back of the first page data from the second cache into the array at 570 can occur without interfering with the second activate operation. Note that while in some embodiments, the write-back of the first page data does not occur until the second page data is loaded into the first cache, in other embodiments, the write-back may begin earlier in time at a point where the write-back does not interfere with the ongoing second activate operation. In some embodiments the write-back includes inversion of the bits in the page and setting of an inversion flag to indicate whether or not the page of data is inverted.

FIG. 6 is a flow chart in which a scenario in which the same page within a bank is activated twice sequentially. At 610 a first activate command for a first page in a first bank is received. At 620, in response to the first activate command, first page data is retrieved from the array and stored in a first cache. As discussed above, the opening of the first page may include setting a flag for the first bank to indicate that a page within that bank is open. Once the first page has been opened, read and write accesses to data in the first page are performed using the first cache. Once those read and write accesses are complete, a precharge command may be received corresponding to the first page, but because delayed write-back operations are being performed in the memory device, the precharge command may not result in the data being shifted from the first cache into a second cache, or written back into the memory array.

At 630, a second activate command for a second page in the first bank is received. Because there is already an open page for the first bank, at 640 the address for the first page is compared with the address for the second page. At 650, if it is determined that the address for the first page matches the address for the second page, the method proceeds to 660 where the first page data is left remaining in the first cache. In addition to leaving the first page data in the first cache, any write-back that would normally occur as a result of the second activate command can also be blocked. Blocking a write-back of the first page data back into the array ensures that if the portion of the array corresponding to the first page data has been left in an intermediate state after the activate command, that intermediate state is preserved such that the eventual write-back of the first page data is not compromised. For example, if the first page data is read from the array using a self-referenced read that leaves all of the memory cells in the page in the array in a "0" or reset state, the write back only requires those memory cells that store a "1" or set state to be written. If the write-back of the first page data were allowed to occur in response to the second activate command even though the data is retained in the first cache, a later write back could require both 0s and 1s to be written back, thereby complicating the later write-back operation.

Thus, while in conventional memory devices, the closing of the first page by a precharge command would have resulted in the data for the first page being stored back in the memory array, embodiments of the delayed write-back described herein result in the first page data remaining in the first cache structure until a subsequent activate operation is initiated. If the second activate operation is to the same page that has already been opened, there is no need to fetch new data to be stored in the first cache. In fact, an attempt to fetch new data from the array would result in garbage data being loaded into the first cache if a self-referenced read is used during the activate operations. As such, if back-to-back accesses to the same page within the same bank occur, the memory device does not have to do any data transfer in order to prepare the first cache for read and write accesses to the first page of data as that data still remains in the cache.

If it is determined at 650 that the same page is not being activated by the second activate command, the method proceeds to perform the operations necessary to facilitate the second activate command. At 670, the first page data is transferred from the first cache to a second cache, which as discussed above, can include parity calculation and majority determination. Also at 670, the second page data is retrieved from the array and stored in the first cache, thereby making the second page data available for read and write accesses using the first cache. Finally, once the activate operation corresponding to the second page has completed, or reached a stage of completion at which the write-back of the first page data would not interfere with the activate, the write-back of the first page data to the array occurs.

The flow chart of FIG. 7 helps to illustrate the scenario in which a write-back indication is received by the memory device, where the write-back indication informs the memory device that any open pages, or closed pages awaiting a write-back, should be cleaned up such that the data corresponding to those pages is returned to non-volatile memory. Such an indication can be provided periodically to the memory device after stopping activity in order to ensure that data in the memory device is stored in non-volatile storage.

At 710 an indication for a write-back is received. As discussed above with respect to FIG. 4, the indication for a write-back can include receipt of a reset signal at 712, receipt of a store command at 714, or receipt of a refresh signal or command, including entry into a self-refresh mode, at 716. In some embodiments, a write-back indication is automatically provided any time the memory device enters a power-down mode. As also discussed above with respect to FIG. 4, a store command such as that received at 714, can indicate that one or more banks should be acted upon. For example, if the memory device is about to be powered-down, a store command can be received that indicates that all banks should be cleaned up so that any memory data currently stored in volatile storage is written back into the non-volatile array.

After receipt of the indication for a write-back at 710, it is determined at 720 whether or not the particular bank to which the indication for a write-back pertains has an open page. If not, no write-back is needed as there is no data corresponding to the bank that is currently in volatile storage. If it is determined at 720 that the bank has an open page, at 730 data stored in the first cache is transferred to the non-volatile array. The transfer at 730 can include either a direct transfer from the first cache to the array, or if the circuitry within the memory device is set up is the data is routed through the second cache on its way to the array, the transfer at 730 includes moving the data from the first cache to the second cache prior to write back from the second cache. The transfer between caches or from one of the caches to the array can include parity calculation and majority determination as discussed above.

When the write back that occurs at 730 involves a large number of memory cells being written to, the write-back can be split into multiple phases. For example, at 732 a first portion of the data is transferred to the array, and then at 734 a second portion of the data is transferred to the array. In a more specific example, a STORE-ALL command may be triggered prior to device shutdown. Such a STORE-ALL command may result in data corresponding to multiple banks being written back into the array. In order to avoid high peak power consumption and large current spikes associated with writing to many memory cells simultaneously, the write-back operations corresponding to a first half of the banks may be performed at 732, whereas the write operations corresponding to a second half of the banks is performed at 734. In other embodiments, a portion of the memory cells in each bank are written during each of steps 732 and 734 such that the write-back operations within each bank are staggered in time.

Figure 8:
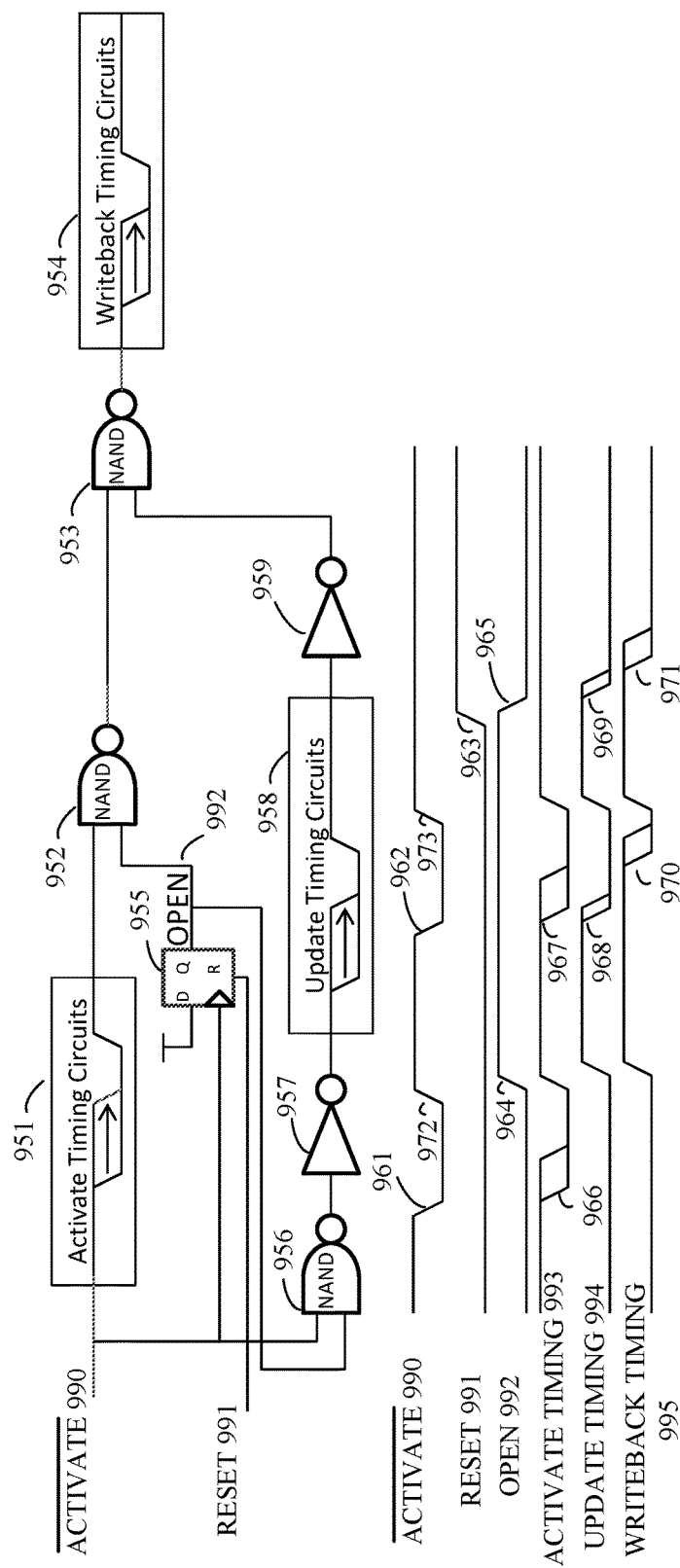
FIG. 8 is a schematic diagram of a portion of a magnetic memory device with an associated timing diagram in accordance with another exemplary embodiment.

FIG. 8 illustrates a circuit diagram associated with a portion of the memory device that includes the use of delayed write-back operations. The timing diagram below the schematic helps to illustrate the functionality of the circuitry. Upon startup, the OPEN signal 992 is low, thereby indicating that no pages in the bank have been opened and thus are awaiting write-back with the next activate. When the/ACTIVATE signal 990 is asserted low for the first time at edge 961, the ACTIVATE TIMING signals 993 are shown to transition from high to low at 966, which represents the generation of the numerous timing signals used in an activate operation. In the embodiment of FIG. 8, these signals are signal transitions directly resulting from the high-to-low transition of the/ACTIVATE signal 990 and are generated by activate timing circuits block 951.

When the/ACTIVATE signal 990 returns high at edge 972 in the timing diagram, the OPEN signal 992, which is the output of flip-flop 955, goes high. The OPEN signal 992 is used to determine that a page has been opened and a write-back for that page should be triggered upon receipt of a subsequent activate assertion. The ACTIVATE TIMING signals 993, UPDATE TIMING signals 994, and WRITE-BACK TIMING signals 995 all go from low to high when the/ACTIVATE signal 990 is deasserted high at 973 with the OPEN signal 992 high. This occurs based on logic gates 952, 953, 956, 957, and 959 and prepares those sets of timing signals for subsequent assertion when the next activate signal assertion occurs. The signals are prepared for assertion as it is known that the next activate will result in an activate of the new page, an update of the parity/majority of the previous page, and a write-back of the previous page.

When next assertion of/ACTIVATE 990 occurs at edge 962, that assertion triggers the assertion of each of the ACTIVATE TIMING signals 993, UPDATE TIMING signals 994, and WRITEBACK TIMING signals 995. Thus, the timing signals to activate the new page are generated by activate timing circuits block 951 (edges 967), the timing signals to update the parity and majority information regarding the previously opened page are generated by update timing circuits block 958 (edges 968), and, after the update and the activate are complete, the signals used to write-back the previously opened page (WRITEBACK TIMING signals 995) are generated by the writeback timing circuits block 954 (edges 970). Upon deassertion of/ACTIVATE 990 at edge 973, each of the timing signal groups of signals is deasserted in preparation for the next activate. The OPEN signal 992 remains high.

When the RESET signal 991 is pulled high at edge 963, this indicates that any data stored in volatile memory should be written back into the array. In other embodiments, the receipt of a refresh command or STORE command can also trigger such a write-back. The assertion of RESET resets flip-flop 955, causing the OPEN signal 992 to go low at edge 965. The transition of the OPEN signal 992 propagates through the circuit, causing the UPDATE TIMING signals 994 to be asserted (edges 969) as well as the WRITEBACK TIMNG signals 995 to be asserted (edges 971). As a result, the timing signals that cause the previously opened page to updated (parity calculation and majority determination) and written back into the memory array.

By delaying the write-back of an open page of data for a bank until a subsequent activate operation is completed, the delay associated with writing the data back to the array can be hidden, thereby improving the access timing associated with the device. Including a new operation code to support data write-back without the need for another activate operation helps to ensure that data is not left in non-volatile storage when power-down occurs. In some instances multiple pages of data may be written back into the array based on a single write-back indication, and the data write-back can be staggered to reduce peak power consumption.

While exemplary embodiments have been presented above, it should be appreciated that many variations exist. Furthermore, while the description uses spin-torque MRAM devices that include memory cells in a specific example arrangements, the teachings may be applied to other memory devices having different architectures in which the same concepts can be applied. Examples of such memory devices include other resistive memories and DRAMs. Such memories would benefit in terms of improved random access time, reduced power consumption, and increased data retention time.

The particular embodiments disclosed above are illustrative only and should not be taken as limitations, as the embodiments may be modified and practiced in different but equivalent manners apparent to those skilled in the art having the benefit of the teachings herein. Accordingly, the foregoing description is not intended to limit the disclosure to the particular form set forth, but on the contrary, is intended to cover such alternatives, modifications and equivalents as may be included within the spirit and scope of the inventions as defined by the appended claims so that those skilled in the art should understand that they can make various changes, substitutions and alterations without departing from the spirit and scope of the inventions in their broadest form.

What is claimed is:

1. A method of operation of a memory, wherein the memory includes an array of memory cells, the method comprising:
    receiving a first activate command and a first address corresponding to a first page within the memory;
    in response to the first activate command:
        retrieving first page data corresponding to the first page from the array of memory cells based on the first address; and
        storing the first page data in a first cache on the memory;
    performing at least one read or write operation corresponding to the first page data as stored in the first cache, wherein the at least one read or write operation accesses specific words or sets of words in the first page data;
    after performing the at least one read or write operation, transferring the first page data from the first cache to a second cache;
    after receiving the first activate command, receiving a second activate command and a second address corresponding to a second page within the memory;
    in response to the second activate command:
        retrieving second page data corresponding to the second page from the array of memory cells based on the second address; and
        storing the second page data in the first cache;
    writing the first page data from the second cache into the array of memory cells at a location corresponding to the first address;
    after receiving the second activate command, receiving an indication that a write-back should be performed for the second page data in the first cache; and
    in response to the indication that a write-back should be performed, writing back a set of write-back data that includes the second page data and data corresponding to additional pages in additional banks of the array, wherein writing back the set of write-back data includes:
        writing the second page data stored in the first cache into the array at a location corresponding to the second address; and
        writing the data corresponding to additional pages in additional banks of the array into the array.

2. The method of claim 1, wherein the indication that a write-back should be performed is a reset signal.

3. The method of claim 1, wherein the indication that a write-back should be performed is a store command.

4. The method of claim 1, wherein the indication that a write-back should be performed is a command to enter a self-refresh mode.

5. The method of claim 1, wherein the indication that a write-back should be performed is a refresh command.

6. The method of claim 1, further comprises staggering the writing of the write-back data in response to the indication that the write-back should be performed, wherein staggering the writing of the write-back data writes back a first portion of the write-back data at a different time than a second portion of the write-back data.

7. The method of claim 1, wherein the first page data is written into the array after the second page data is stored in the first cache.

8. The method of claim 1, wherein the first page data is transferred from the first cache to the second cache in response to the second activate command.

9. The method of claim 1, further comprising:
    receiving a precharge command prior to the second activate command, wherein the first page data is transferred from the first cache to the second cache in response to the precharge command.

10. The method of claim 1, wherein transferring the first page data from the first cache to the second cache further comprises at least one of:
    calculating parity for the first page data; and
    performing a majority detection with respect to the first page data, wherein the majority detection determines if a majority of bits in the first page data are in a first state or a second state, wherein writing the first page data from the second cache in to the array includes inverting the bits in the first page data when the majority of bits in the first page are in the second state.

11. A memory, comprising:
    an array of memory cells, wherein the array of memory cells includes a first bank and a second bank;
    a plurality of caches coupled to the array, the plurality of caches including:
        a first cache coupled to the first bank of the array;
        a second cache coupled to the first bank of the array;
        a third cache coupled to the second bank of the array; and
        a fourth cache coupled to the second bank of the array;
    control circuitry coupled to the array and the plurality of caches, wherein the control circuitry is configured to:
        in response to a first activate command, transfer first page data from a first location in the first bank to the first cache;
        in response to a second activate command, transfer second page data from a first location in the second bank to the third cache;
        after transferring the first page data to the first cache, transfer the first page data from the first cache to the second cache;
        after transferring the first page data to the second cache and in response to a third activate command, transfer third page data from a second location in the first bank to the first cache; and transfer the first page data from the second cache to the first location in the first bank.

12. The memory of claim 11, wherein, after receiving the third activate command and in response to an indication that a write back should be performed, the control circuitry is configured to:
  transfer the second page data from the third cache to the first location in the second bank; and
  transfer the third page data from the first cache to the second location in the first bank.

13. The memory of claim 12, wherein the indication that a write-back should be performed is a reset signal.

14. The memory of claim 12, wherein the indication that a write-back should be performed is a store command.

15. The memory of claim 12, wherein the indication that a write-back should be performed is one of a command to enter a self-refresh mode and a refresh command.

16. The memory of claim 12, where the control circuitry is configured to stagger data transfers in response to the indication that a write-back should be performed such that a first portion of write-back data is transferred at a different time than a second portion of the write-back data, wherein the write-back data includes the second page data in the third cache and the third page data in the first cache.

17. The memory of claim 11 further comprising:
  a parity calculator coupled to at least one of the first cache and the second cache, wherein the parity calculator is configured to calculate parity for each page of data; and
  a majority detection circuit coupled to at least one of the first cache and the second cache, wherein the majority detection circuit is configured to determine if a majority of bits in each page of data are in a first state or a second state.

18. The memory of claim 11, wherein the control circuitry includes a delay circuit, wherein the delay circuit generates a plurality of timing signals used in transferring data amongst the first bank of the array, the first cache, and the second cache.

19. A method of operation of a memory, wherein the memory includes an array of memory cells, the method comprising:
  receiving a first activate command and a first address corresponding to a first page within the memory;
  in response to the first activate command:
    retrieving first page data corresponding to the first page from the array of memory cells based on the first address; and
    storing the first page data in a first cache on the memory;
  transferring the first page data from the first cache to a second cache;
  after receiving the first activate command, receiving a second activate command and a second address corresponding to a second page within the memory;
  in response to the second activate command and after transferring the first page data from the first cache to the second cache:
    retrieving second page data corresponding to the second page from the array of memory cells based on the second address; and
    storing the second page data in the first cache;
  after receiving the second activate command, receiving an indication that a write-back should be performed for the second page data in the first cache; and
  in response to the indication that a write-back should be performed, writing back a set of write-back data that includes the second page data and data corresponding to additional pages, wherein writing back the set of write-back data includes:
    writing the second page data stored in the first cache into the array at a location corresponding to the second address; and
    writing the data corresponding to additional pages into the array.

20. The method of claim 19, further comprises staggering the writing of the write-back data in response to the indication that the write-back should be performed, wherein staggering the writing of the write-back data writes back a first portion of the write-back data at a different time than a second portion of the write-back data.

* * * * *